US006563435B1

(12) United States Patent
Platz

(10) Patent No.: US 6,563,435 B1
(45) Date of Patent: May 13, 2003

(54) GLASS KEYBOARD AND METHOD FOR PRODUCING A GLASS KEYBOARD

(76) Inventor: Karl-Otto Platz, Eckenhagener Strasse 16, 51580 Reichshof (DE)

( * ) Notice: Subject to any disclaimer, the term of this patent is extended or adjusted under 35 U.S.C. 154(b) by 0 days.

(21) Appl. No.: 09/623,891

(22) PCT Filed: Mar. 10, 1999

(86) PCT No.: PCT/EP99/01567

§ 371 (c)(1), (2), (4) Date: Nov. 21, 2000

(87) PCT Pub. No.: WO99/46788

PCT Pub. Date: Sep. 16, 1999

(30) Foreign Application Priority Data

Mar. 11, 1998 (DE) ........................................ 198 10 329

(51) Int. Cl.[7] ............................................... H03M 11/00

(52) U.S. Cl. ......................... 341/34; 200/5 A; 200/512; 338/99; 338/114

(58) Field of Search ............................ 341/34; 200/5 A, 200/512; 338/99, 114; 345/173

(56) References Cited

U.S. PATENT DOCUMENTS 4,901,074 A * 2/1990 Sinn et al. ..................... 341/22
4,975,676 A * 12/1990 Greenhalgh ................. 338/114
6,380,497 B1 * 4/2002 Hashimoto et al. .......... 200/5 A

* cited by examiner

*Primary Examiner*—Michael Horabik
*Assistant Examiner*—Albert K. Wong
(74) *Attorney, Agent, or Firm*—Diller, Ramik & Wight

(57) ABSTRACT

In a glass keyboard comprising a keyboard surface (4) made from a flexible thin glass pane (2) and at least one carrier material pane (6), each pane being provided with an electroconductive layer (8,10) on the faces facing each other, wherein the opposing electroconductive layers (8,10) are kept at a distance to each other with the aid of a spacer (12), and wherein the electroconductive layers (8,10) touch each other when pressure is applied to the flexible thin glass layer (2) at the essentially localized place of pressure application, it is provided that the flexible thin glass pane (2) is made from a drawn thin glass film.

22 Claims, 4 Drawing Sheets

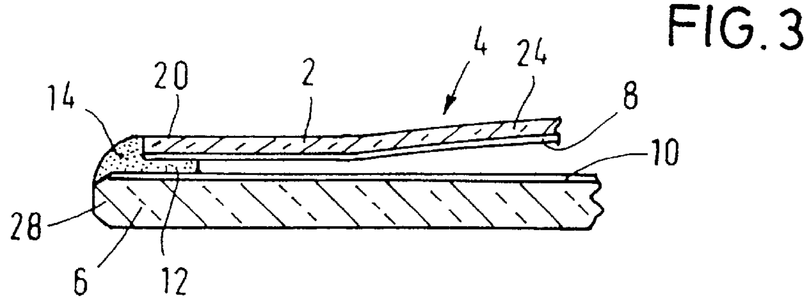
FIG. 3
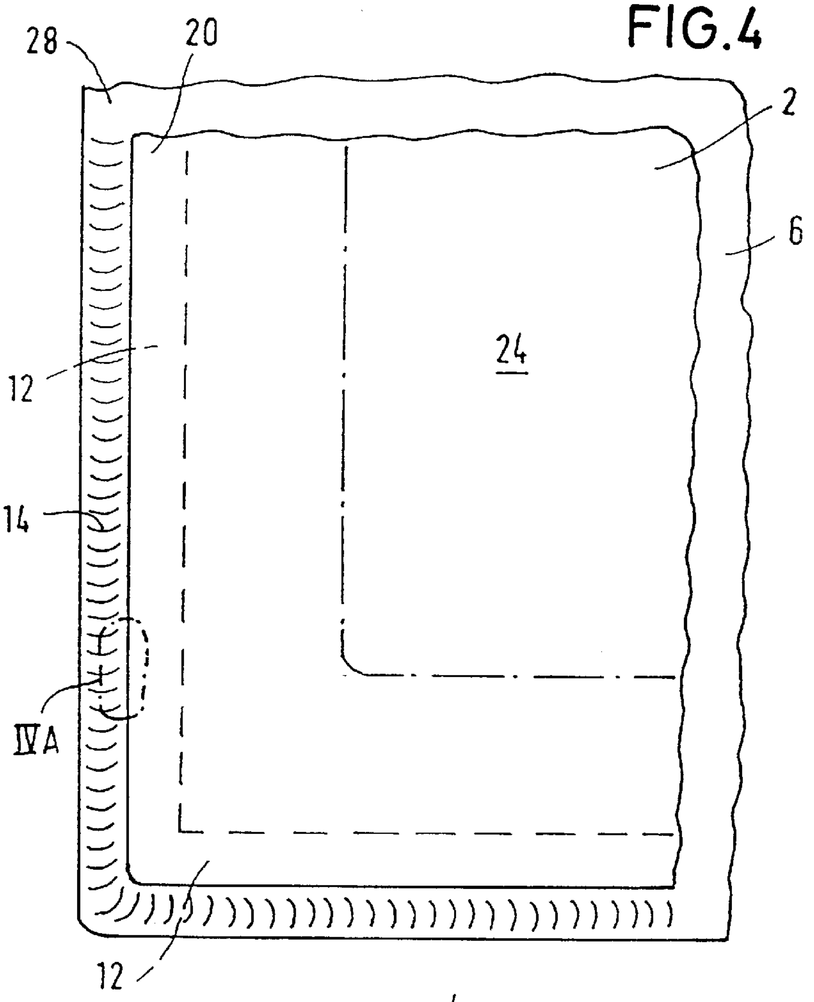
FIG. 4
FIG. 4A
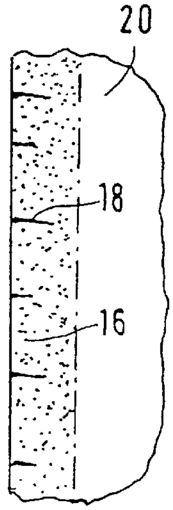
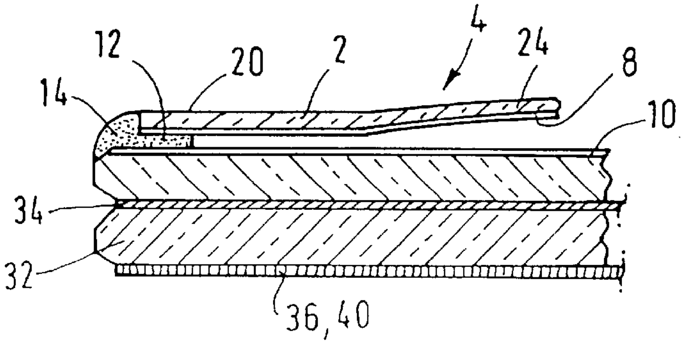
FIG. 5

FIG.8
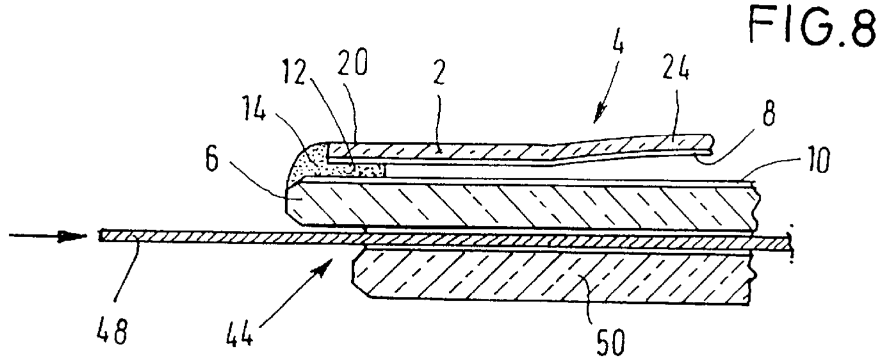
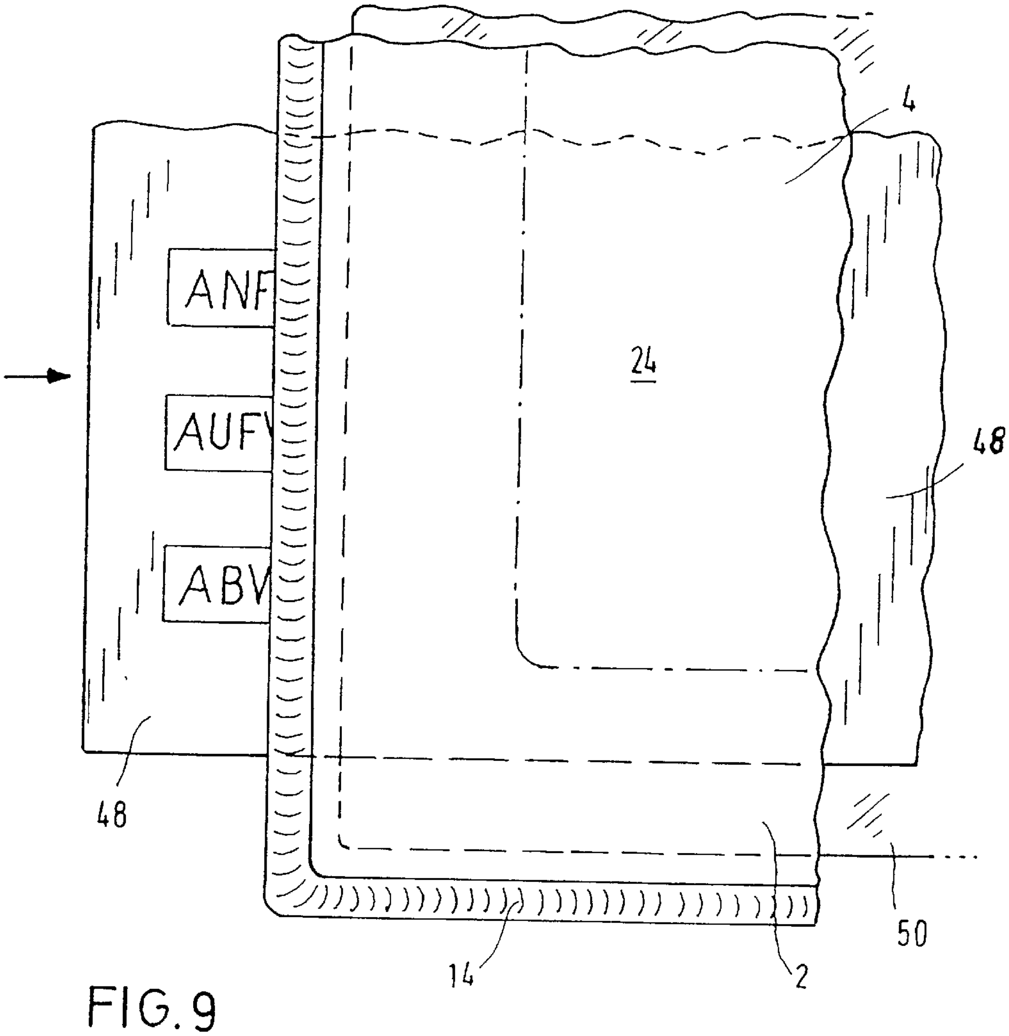
FIG.9

GLASS KEYBOARD AND METHOD FOR PRODUCING A GLASS KEYBOARD

BACKGROUND OF THE INVENTION

The present invention relates to a glass keyboard and to a method for producing a glass keyboard.

Such pressure switch elements are known as touch panels in displays. The touch panels are normally made from transparent plastic films whose inner surfaces are coated with an electroconductive material. To support said films spacers are glued in the air gap, wherein a spacer arranged around the outside of the contact area is bonded in an airtight manner to the plastic films to stabilize the inside air pressure thus supporting the upper film. Inside the contact area elastic spacers are additionally provided which ensure return movement of the films. It is a drawback of the known pressure switch element that it requires a hermetically sealed air space which does not allow for any pressure compensation. In the event of considerable deviation from the normal atmospheric pressure, e. g. during application in submarine vehicles or in aeronautics and space operations, and at high temperatures hairline cracks occur in the vapour-deposited electroconductive contact layer due to the changes in air pressure, which results in a failure of the unit. At large heights the spacer in the contact area expands. This changes the switching path of the contact film, and the given electronical and mechanical parameters, such as the action point, are no longer complied with. Further drawbacks of the known touch panels are that the plastic films present only a limited mechanical and chemical resistance, a small degree of transmission and are not antistatic. Further, in the event of temperature variation there is the danger of crack formation in the electroconductive layer due to fact that the expansion coefficients of the conductive layer and the plastic carrier considerably differ from each other.

From EP 0 546 003 B1 a pressure switch element made from a glass laminate is known which comprises a flexible thin glass pane and at least one carrier glass pane, each pane being provided with an electroconductive layer on the faces facing each other. The opposing electroconductive layers are kept at a distance to each other with the aid of a spacer. The electroconductive layers touch each other when pressure is applied to the flexibel thin glass layer at the essentially localized place of pressure load application.

The known pressure switch element comprises a shock and pressure-sensitive thin glass pane.

SUMMARY OF THE INVENTION

It is the object of the invention to provide a glass keyboard with reduced pressure and shock sensititivity thus allowing large-scale production. According to the invention the flexible thin glass pane is preferably made up of a drawn thin glass film. It is important that the thin glass pane is produced from a drawn thin glass film since only this type of pane is sufficiently stable and flexible at the same time. The drawn thin glass film thus allows production of a break-proof thin glass pane which is flexible enough to allow contact to be established between the electroconductive layers facing each other.

According to an alternative embodiment the carrier material pane is slightly larger than the flexible thin glass pane such that the marginal area of the carrier material pane protrudes beyond the the marginal area of the thin glass pane. The protruding marginal area of the carrier material pane protects the sensitive marginal edge of the thin glass pane, which can further reduce the danger of breakage of the thin glass pane.

In the marginal area the flat set back margin of the thin glass pane is glued to the marginal area of the carrier material pane by means of an adhesive acting as a spacer. The protruding margin of the carrier material pane is further adapted to receive an adhesive build-up which also protects the sensivitve edge of the thin glass pane.

Preferably the margin of the thin glass pane is stabilized by means of a cured plastic material. The cutting edge of the thin glass pane displays a plurality of microcracks which occur during the cutting process and extend from the edge to the inside. Said microcracks may easily result in a crack which destroys the entire thin glass pane. The margin of the thin glass pane is therefore preferably stabilized by means of a cured plastic material. For this purpose the boundary edges of the thin glass pane are dipped into a liquid plastic material. Due to the capillary effect the microcracks are filled with the liquid plastic material whereafter the plastic material cures. When the plastic material is cured, the thin glass pane offers a considerably higher stability since breaking of the thin glass pane starting from its margins can no longer occur in the event of pressure or shock load.

The keyboard surface made from the flexible thin glass pane may be of flat configuration in the marginal area and present a-slight convexity to the out-side in the keyboard area. The convexity of the keyboard surface improves on the one hand the return movement behaviour of the thin glass pane after operation and prevents on the other hand the occurrence of Newton's rings which are undesired in a glass keyboard for optical reasons.

A thin glass pane is preferably glued to the carrier material pane in the deep-drawn state of the former. For this purpose the thin glass pane is deep drawn in cold condition and in this condition glued to the carrier material pane such that the convexity of the keyboard is maintained.

The thickness of the thin glass pane ranges between approximately 0.1 and 0.5 mm, preferably between approximately 0.175 and 0.4 mm. A thin glass pane of such a thickness offers an adequate flexibility to allow for localized switching contact between opposing electroconductive layers.

The spacer is arranged exclusively in the marginal area of the keyboard surface between the thin glass pane and the carrier material pane, wherein in the remaining portion of the keyboard surface switching operations can be performed at any location without further spacers being provided. The invention preferably makes additional spacers in the area of the switching section superfluous such that the overall keyboard surface is available for switching operations without any limitations.

In a preferred embodiment the spacer in the marginal area is made from a plastic material cured under UV-light. This offers the advantage that no separate spacer has to be provided, and that the spacer can already be formed when the thin glass pane is glued to the carrier material pane.

The carrier material pane is preferably transparent. This allows e. g. keyboard letterings and/or illumination means to be provided behind the carrier material pane.

Preferably the carrier material pane is made of glass. This offers the advantage that the expansion coefficients of a carrier material pane made of glass and of the electroconductive layer, e. g. an indium tin oxide layer, display only minor differences such that the danger of crack formation in the electro-conductive layer is reduced.

According to a preferred aspect of the invention the carrier material pane is made from a transparent glass cell with integrated electroluminescent matrix (EL display glass).

The carrier material pane can be made from multilayer glass to ensure protection against splintering. Such a glass keyboard can preferably be employed in areas where there is the danger of explosion or vandalism. The use of multilayer glass further offers the advantage of a cut-off effect against UV-light.

The carrier material pane may comprise a heating means on the side averting the thin glass pane.

The heating means preferably is an electroconductive transparent coating applied to the carrier material pane.

The carrier material pane may also comprise an electroconducting shielding layer on the side averting the thin glass pane, said layer shielding electromagnetic perturbing radiation occurring behind the glass keyboard, e. g. from the electronic control unit, thus reducing the susceptibility of the glass keyboard to electromagnetic interference.

The transparent carrier material pane may form an optical filter or be provided with such a filter.

According to another aspect of the invention the carrier material pane comprises a receiving means for an exchangeable sheet for keyboard lettering on the side averting the thin glass pane. Such a receiving means is e. g. configured as an insertion pocket for the exchangeable sheet. The exchangeability of the sheet for keyboard lettering allows the functions of certain keyboard fields to be fixed individually or to be subsequently changed. In the case of machine control it is thus possible to e. g. assign the keyboard fields on the keyboard surface to different functions according to requirement.

The carrier material pane and/or the spacer comprise in the marginal area vent openings for the space between the thin glass pane and the carrier material pane. This offers the advantage that pressure compensation is possible in the event of deviation from the normal atmospheric pressure, e. g. during application in submarine vehicles or in aeronautics and space operations, and at high temperatures such that the electroconductive layers on the thin glass pane and the carrier material pane are prevented from being damaged.

The vent openings are preferably provided with a filter material protecting the glass keyboard from soiling.

The carrier material pane may comprise a light-scattering layer on the side averting the thin glass pane. Such a coating or surface treatment is advantageous e.g. in the case of background illumination.

The thin glass pane may comprise a decorative margin on its lower side. The decorative margin offers the advantage that on the one hand the keyboard surface to be operated is limited whereby the switching section to be operated is easily recognizable and on the other hand larger production and installation tolerances are available for means located behind the pane, such as LCD displays, which may decrease the production costs.

Further preferred features of the invention are stated in the subclaims.

Hereunder embodiments of the invention are explained in detail with reference to the drawings in which:

BRIEF DESCRIPTION OF THE DRAWINGS

FIG. 3 shows an enlarged view of the edges,

FIG. 4 shows a top view of a corner area of the glass keyboard,

FIG. 4A shows the detail of FIG. 4,

FIG. 5 shows a glass keyboard with a multilayer glass pane as carrier material pane.

DESCRIPTION OF THE PREFERRED EMBODIMENTS

Figure 1:
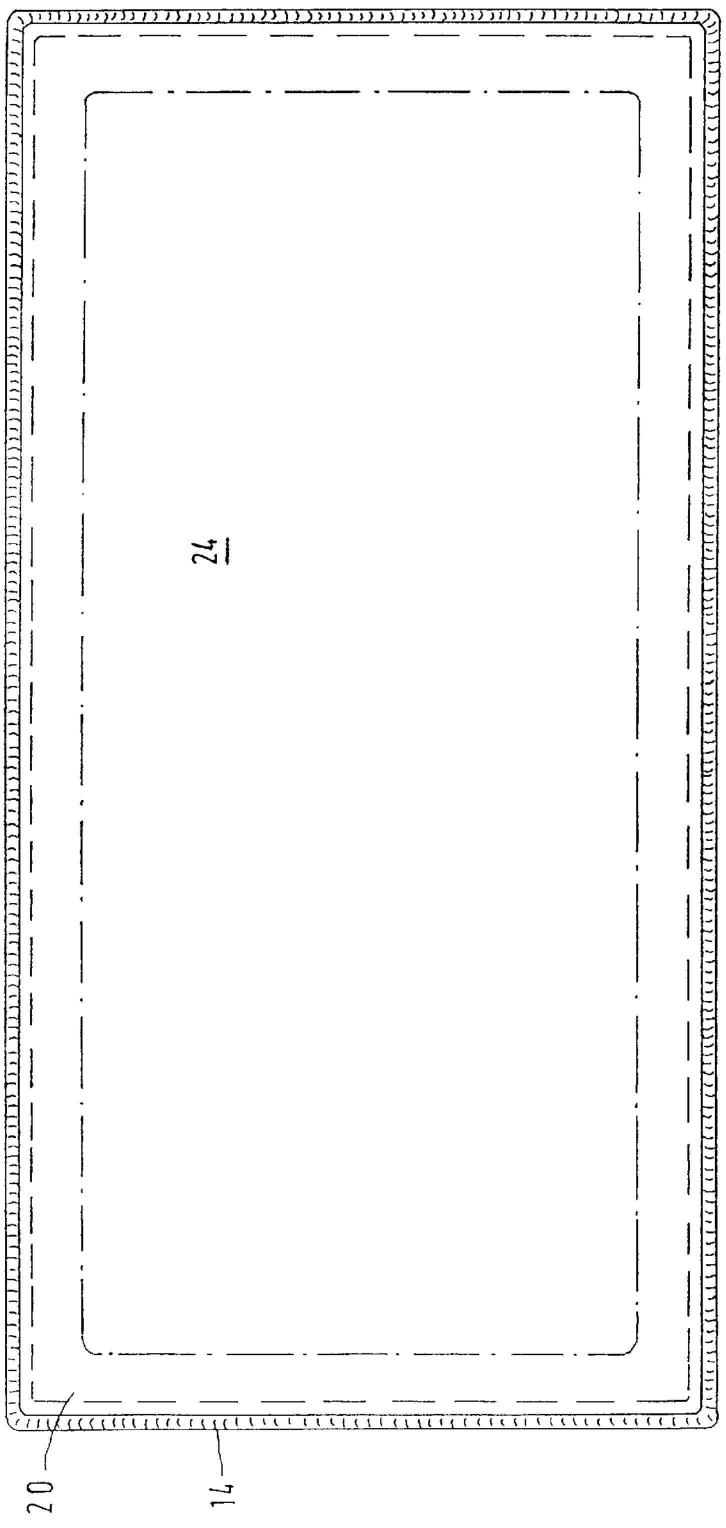
FIG. 1 shows the glass keyboard according to the invention.
Figure 2:
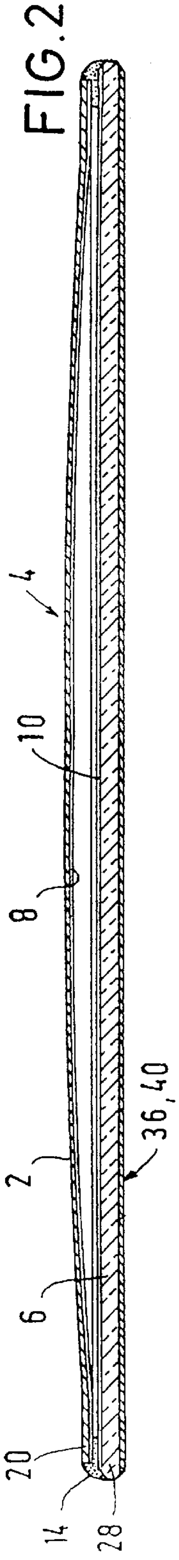
FIG. 2 shows a cross-section of the glass keyboard shown in FIG. 1.
Figure 6:
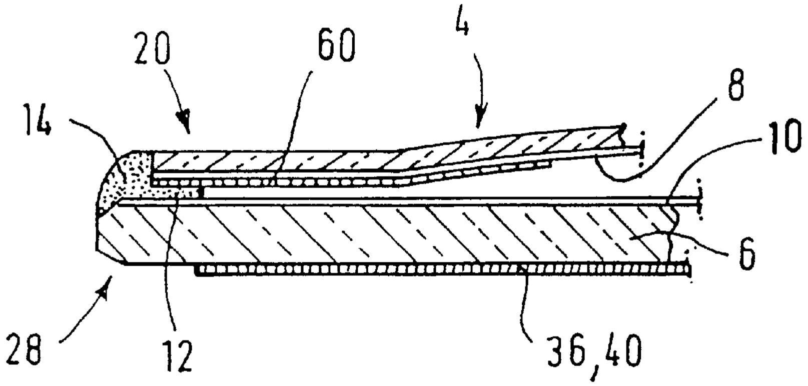
FIG. 6 shows an embodiment with an electroconductive layer on the rear side of the carrier material pane and a decorative margin under the thin glass pane.
Figure 7:
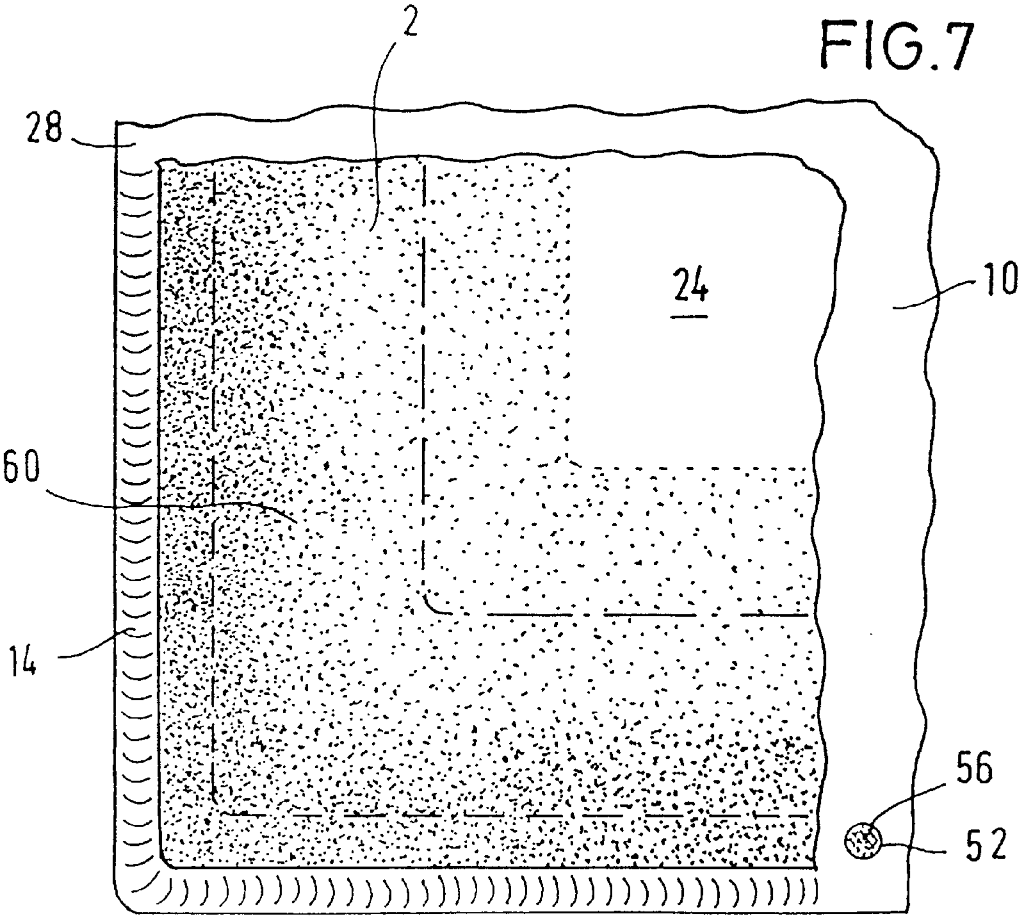
FIG. 7 shows a top view of the embodiment shown in FIG. 6, and FIGS. 8 and 9 show an embodiment of the glass keyboard with an insertion pocket for a sheet behind the carrier material pane.

The glass keyboard shown in FIG. 1 comprises a relatively thick lower carrier material pane 6 and a thin glass pane 2 kept at a parallel distance to the carrier material pane 6 with the aid of a spacer 12. The thin glass pane 2 and the carrier material pane 6 are provided with electroconductive layers 8,10 on the opposing inner faces, the electroconductive layers 8,10 forming electrodes and establishing a switching contact when the layers touch each other. For this purpose the flexible thin glass pane 2 may be deformed by essentially localized pressure application such that an electric contact is established between the conductive layers 8,10.

Such a configuration of the glass keyboard can be employed for both analog glass keyboards where the electroconductive layers 8,10 essentially cover the entire keyboard surface 4, and digital glass keyboards where the electroconductive layers 8,10 are structured and comprise e. g. a plurality of conductors arranged parallel to each other. The conductors on the electroconductive layer 8 are preferably arranged at right angles to the conductors on the electroconductive layer 10.

The thin glass pane 2 is cut out of a drawn thin glass film and has a thickness ranging between approximately 0.1 and 0.5 mm, preferably between approximately 0.175 and 0.4 mm. Float glass of the same thickness comprises a tin film which leads to embrittlement of the glass and is thus not suitable for this application. Only thin glass panes produced from a drawn glass film have an adequate flexibility and breaking strength which allow even larger keyboard surfaces 4 to be produced. Further, the glass thickness must be uniform to a high degree.

The thin glass pane 2 has a slight convexity to the outside and is glued in this condition to the carrier material pane 6 using the spacer 12. For this purpose the thin glass pane 2 is deep drawn with there remaining a flat marginal area 20. The spacer is preferably formed by the adhesive glueing the two panes 2,6 together with glueing being carried out only at the edge of the marginal area 20 of the thin glass pane 2. The carrier material pane 6 protrudes on all sides beyond the thin glass pane 2 thus allowing for effective protection of the sensitive outer edges of the thin glass pane 2. At the same time the protruding margin of the carrier material pane 6 forms a supporting surface for an adhesive build-up 14 which reaches up to the upper edge of the thin glass pane 2. Said adhesive build-up 14 additionally protects the sensitive outer edge of the thin glass pane 2.

The convexity of the thin glass pane 2 to the outside offers the advantage that higher return movement forces are produced, and that the thin glass pane 2 does not require further spacers to be arranged in the area of the key-board surface 4. It is important that no spacers are provided in the switching area 24 of the keyboard surface 4 since it would not be possible to establish a switching contact in the area of such spacers. The glass keyboard described here can be operated at any location of the keyboard surface 4.

Another advantage of the convexity of the thin glass pane 2 to the outside is that the formation of Newton's rings, which are undesired in transparent keyboards, is prevented.

Employment of glass as keyboard surface 4 offers the advantage that a scratch-resistant glass keyboard with a high degree of transmission is created which presents a higher chemical resistance and is antistatic. The thermal expansion coefficients and the deformation behaviours under pressure of glass and electroconductive layer differ from each other only to a small degree such that the danger of crack formation in the electroconductive layers is considerably reduced as compared with plastic films.

The thin glass pane 2 may be edge-stabilized. Edge stabilizing is realized by dipping the cutting edges of the thin glass pane 2 cut out of a drawn thin glass film into a highly viscous curable plastic material. Due to the capillary effect the liquid plastic material penetrates microcracks 18 in the edge area 20 which occur during the cutting process, wherein said microcracks 18 are filled with plastic material 16 by the subsequent curing of the plastic material such that there is no longer the danger that the microcracks 18 lead to breaking. This facilitates handling and processing of the thin glass panes 2. It is however also possible to stabilize the edges only when the thin glass pane 2 is glued to the carrier material pane 6. The adhesive has then several functions, i. e. it acts as a spacer 12 between the thin glass pane 2 and the carrier material pane 6, it acts as edge stabilizer by penetrating the microcracks 18 in the edge area 20 of the thin glass pane 2, and it acts as outer edge protection for the thin glass pane 2 by forming an adhesive build-up 14 on the protruding margin of the carrier material pane 6. The adhesive build-up 14 is preferably produced in a second working cycle.

The margin of the carrier material pane 6 protrudes beyond the outer edges of the thin glass pane 2 by e. g. approximately 1 mm thus forming, in conjunction with the adhesive build-up 14, an effective protection against shocks on the outer margin of the glass keyboard.

The carrier material pane is preferably made from transparent material. This offers the advantage that the glass keyboard behind the carrier material pane can be provided with marking fields or letterings of any configuration. Further, illumination means, e. g. LED lamps for functional displays or for illuminating the sheet 48, may be arranged behind the carrier material pane 6. Of course, display screens or LCD-displays and similar may also be arranged behind the carrier material pane.

A plastic material curing under UV-light is preferably used as adhesive. Such an adhesive offers the advantage that the time of curing can be exactly controlled, which considerably facilitates the production process.

It is particularly advantageous that the carrier material pane 6 is made from glass. The thickness of the carrier material pane 6 depends on the anticipated mechanical stresses and amounts preferably to more than 1 mm. It is also possible to provide a carrier material pane 6 made of thin glass if another supporting structure is arranged behind the carrier material pane 6.

The carrier material pane 6 may also be made from multilayer glass 22. For this purpose the carrier material pane 6 made from glass may be provided with an adhesive or a film on the side averting the thin glass pane 2 and bonded with a second glass pane. The film may be coloured. Such a multilayer glass serves as protection against splintering and is provided e. g. when the glass keyboards are employed in areas where there is the danger of explosion or vandalism. The use of multilayer glass further offers the advantage of a cut-off effect against UV-light.

The carrier material pane 6 or the multilayer pane 32 may be provided with an electroconductive layer on the side averting the thin glass pane 2, said electroconductive layer serving e. g. as a shielding layer 40 against electromagnetic radiation or as a heating means 36.

The electric coating has a resistance value of more than 100 Ω so as to act as sheet heating. At a resistance value of <20 Ω the electric coating is suited for shielding purposes.

The lower side of the thin glass pane 2 may be provided with a decorative margin 60 in its marginal area 20, the decorative margin 60 preferably ending in a dot screen towards the inside. Said decorative margin is produced by means of the screen printing technique and forms a mask defining the switching area 24 of the keyboard surface 4. The decorative margin forms a camouflage for the glued marginal area 20,28 of the glass keyboard as well as a camouflage for continuous conductor guides for establishing contact between the electroconductive layers 8,10. Due to the fact that towards the inside the dot screen of the decorative margin gradually ends in the transparent area, it is e. g. possible to install an LCD-display behind the carrier material pane with a larger tolerance and thus in a less expensive way.

Further, the decorative margin covers the connecting contacts glued to the carrier pane.

The carrier material pane 6 may be mat or opaque on the side averting the thin glass pane 2 to scatter the light of LED-displays located behind the carrier material pane 6.

In a particularly preferred embodiment a receiving means 44 for an exchangeable insertion sheet 48 is arranged on the side of the carrier material pane 6 averting the thin glass pane 2. The insertion sheet 48 serves for the marking of keyboard fields of the keyboard surface 4. The insertion sheet 48 may e. g. be made of paper on which characters or symbols may be printed. The paper may be laminated to be water-proof. Of course, the insertion sheet 48 may also be made of plastic material.

In the embodiment shown in FIGS. 8 and 9 the receiving means 44 for the insertion sheet 48 is made of a transparent or opaque plate 50 which is fastened at a distance to the carrier material pane 6 such that it forms an insertion pocket for the insertion sheet 48.

Although a preferred embodiment of the invention has been specifically illustrated and described herein, it is to be understood that minor variations may be made in the apparatus without departing from the spirit and scope of the invention, as defined the appended claims.

What is claimed is:

1. A glass keyboard comprising a keyboard surface (4) made from a flexible thin glass pane (2) and having a marginal area (20) and at least one carrier material pane (6), the flexible glass and carrier material panes (2, 6, respectively) being provided on respective faces facing each other with an electroconductive layer (8, 10, respectively), the opposing electroconductive layers (8, 10) being kept at a distance from each other by a spacer (12), the electroconductive layers (8, 10) touch each other when pressure is applied to the flexible thin glass pane (2) substantially at a localized area of pressure application, the carrier material pane (6) being slightly larger than the flexible thin glass pane (2) such that a marginal area (28) of the carrier material pane (6) protrudes on all sides beyond the marginal area (20) of the thin glass pane (2), and the marginal area (20) of the thin glass pane (2) is glued to the marginal area (28) of the carrier material pane (6) by means of adhesive acting as said spacer (12) for maintaining the electroconductive layers (8, 10) of the respective flexible glass and carrier material panes (2,6, respectively) normally spaced from each other.

2. Glass keyboard according to claim 1 wherein the flexible thin glass pane (2) is made from a drawn thin glass film.

3. Glass keyboard according to claim 1 wherein the margin area (20) of the thin glass pane (2) is stabilized by means of a cured plastic material (16).

4. Glass keyboard according to claim 1 wherein the keyboard surface (4) made from the flexible thin glass pane (2) is of flat configuration in the marginal area (20) thereof and includes a slight outward convexity in a switching area (24).

5. Glass keyboard according to claim 1 wherein the thin glass pane (2) forming the keyboard surface (4) is made from a drawn thin glass film glued to the carrier material pane (6).

6. Glass keyboard according to claim 1 wherein the thickness of the thin glass pane (2) ranges between approximately 0.1 and approximately 0.5 mm, preferably between 0.175 and 0.4 mm.

7. Glass keyboard according to claim 1 wherein the spacer (12) is arranged exclusively between the marginal areas (20, 28) of the thin glass pane (2) and the carrier material pane (6), and a remaining portion of the keyboard surface (4) is adapted for localized switching at any location without any further spacer being provided.

8. Glass keyboard according to claim 1 wherein the spacer (12) between the marginal areas (20, 28) is made from a plastic material cured under UV-light.

9. Glass keyboard according to claim 1 vherein the carrier material pane (6) is transparent.

10. Glass keyboard according to claim 1 wherein the carrier material pane (6) is made from glass.

11. Glass keyboard according to claim 1 wherein the carrier material pane (6) is made from a transparent glass cell with integrated electroluminescent matrix.

12. Glass keyboard according to claim 1 wherein the carrier material pane (6) is made from a multilayer glass (32) as protection against splintering.

13. Glass keyboard according to claim 1 wherein the carrier material pane (6) comprises a heating means (36) on the side averting the thin glass pane (2).

14. Glass keyboard according to claim 13 wherein the heating means (36). is an electroconductive coating applied to the carrier material pane (6).

15. Glass keyboard according to claim 1 wherein the carrier material pane (6) comprises an electroconductive shielding layer (40) on the side averting the thin glass pane (2).

16. Glass keyboard according to claim 1 wherein the carrier material pane (6) is transparent and forms an optical filter or comprises an optical filter.

17. Glass keyboard according to claim 1 wherein the carrier material pane (6) comprises on the side averting the thin glass pane (2) a receiving means (44) for an exchangeable sheet (48) for keyboard lettering.

18. Glass keyboard according to claim 1 wherein at least one of the carrier material pane (6) and the spacer (12) include area vent openings (52) in at least one of the respective marginal areas (20, 28) thereof for venting an intermediate area between the thin glass pane (2) and the carrier material pane (6).

19. Glass keyboard according to claim 18 wherein the vent openings (52) are provided with a filter material (56).

20. Glass keyboard according to claim 18 wherein the carrier material pane (6) comprises a light-scattering layer on the side averting the thin glass pane (2).

21. Glass keyboard according to claim 18 wherein the thin glass pane (2) comprises a decorative margin (60) on a lower side thereof.

22. Glass keyboard according to claim 21 wherein the decorative margin (60) is screen printing and ends in a dot screen towards an inside.

* * * * *